United States Patent [19]

Snow

[11] 3,814,846

[45] June 4, 1974

[54] HIGH DENSITY PHOTODETECTION ARRAY

[75] Inventor: Edward H. Snow, Los Altos, Calif.

[73] Assignee: Reticon Corporation, Mountain View, Calif.

[22] Filed: Jan. 20, 1972

[21] Appl. No.: 219,357

[52] U.S. Cl. .............................. 178/7.1, 250/211 J

[51] Int. Cl. .......................... H04n 1/04, H01j 39/12

[58] Field of Search ...................... 178/7.1; 307/311; 250/211 J; 317/235 N

[56] References Cited

UNITED STATES PATENTS

| | | | |
|---|---|---|---|
| 3,522,435 | 8/1970 | Brean et al. | 317/235 N |
| 3,577,175 | 5/1971 | Gri et al. | 317/235 N |
| 3,577,631 | 5/1971 | Bylander et al. | 317/235 N |
| 3,717,770 | 2/1973 | Dyck et al. | 250/211 J |

OTHER PUBLICATIONS

From the Digest of Technical Papers of the IEEE ISSCC Feb. 18, 1971 Univ. of Pennsylvania, pages 130, 131, 202, G. P. Weckler et al.

IBM Technical Disclosure Bulletin; Vol. 9, No. 9, February, 1967 pp. 1231–1232 "Interlaced Scanistor" H. van Steenis.

*Primary Examiner*—Robert L. Griffin
*Assistant Examiner*—George G. Stellar
*Attorney, Agent, or Firm*—Spensley, Horn & Lubitz

[57] ABSTRACT

A self-scanning photodiode array which includes a row of photodiodes and at least two shift counters, one or more disposed on each side of the row of photodiodes is disclosed. The photodiodes are each coupled to one of the shift counters and one of two or more video lines. With this arrangement not only a higher density array is achieved but the scanning rate of the photodiodes is increased over the prior art.

8 Claims, 3 Drawing Figures

HIGH DENSITY PHOTODETECTION ARRAY

BACKGROUND OF THE INVENTION

1. Field of the Invention

The invention relates to the field of self-scanning photodetection arrays.

2. Prior Art

Self-scanning photodetection arrays which utilize solid state photo-sensitive devices are well known in the art. Among these devices are phototransistors and photodiodes which operate in a storage mode. These devices, when operated in the storage mode with a junction reverse biased, have the characteristics of a capacitor with a parallel current source. When the junction is open circuited the junction slowly discharges as electrons and holes are generated thermally and neutralize the stored charge on each side of the junction. With the application of light to the junction the discharge of the junction occurs much more rapidly and hence the junction may be used to sense light. Typically, the junction is recharged periodically and the recharging current is sensed; this current is a function of the total incident light on the junction. Such charge storage devices may be fabricated using metalozide-semiconductor (MOS) technology. For a general discussion of such devices see "Charge Storage Lights the Way for Solid State Image Sensors" by Gene P. Weckler, *Electronics*, May 1, 1967, pages 75–78.

In many pattern recognition applications which utilize an array of photodiodes or phototransistors in a storage mode of operation an elongated row of the photo-sensitive devices is scanned electrically. Typically, the electrical circuitry utilized to scan the photo-sensitive devices is incorporated on the same semiconductor substrate or chip as the photosensitive devices. The usefulness of such arrays is often limited by (1) the scanning rate of the arrays, that is, the ability to rapidly scan (or recharge) the photo-sensitive devices in order to read print or other patterns at high speeds, and (2) the density of the photo-sensitive devices, that is, the ability to compress a large number of such devices into a small area in order to achieve high resolution. As will be seen, the present invention provides a high density photodetection array which provides better resolution and higher scanning speeds than the prior art. Specific prior art will be discussed more fully in conjunction with FIG. 1.

SUMMARY OF THE INVENTION

A self-scanning photodetection array, particularly adaptable for fabrication utilizing MOS technology and which in the preferred embodiment utilizes photodiodes in a storage mode is described. The array includes an upper shift counter and lower shift counter in juxtaposition. A plurality of photodiodes is disposed between the upper and lower shift counters. Every other diode in the row is coupled to the upper shift counter while the remaining diodes are coupled to the lower shift counter. Switching means interconnect each of the diodes with its respective shift counter. All the photodiodes associated with the upper shift counter are coupled to an upper video line while all the diodes associated with the lower shift counter are coupled to a lower video line. By the application of two timing signals of the same frequency but out of phase from one another the array may be scanned and the results sensed on the video lines.

DETAILED DESCRIPTION OF THE INVENTION

Figure 1:
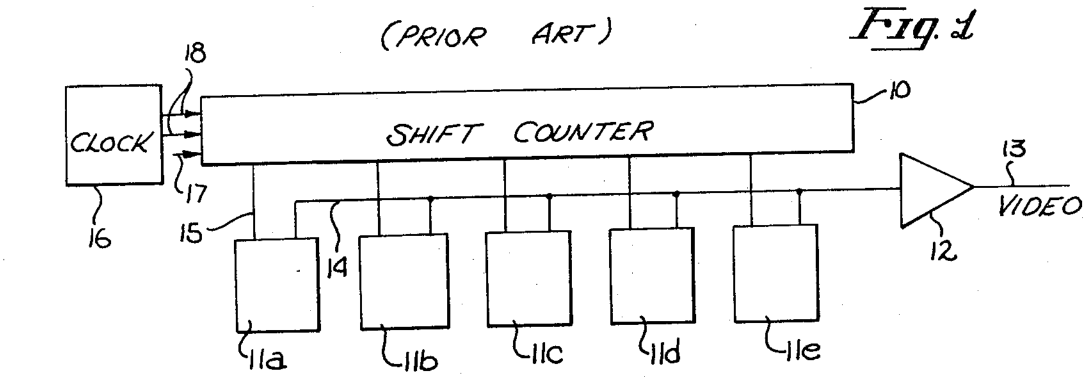
FIG. 1 is a block diagram illustrating a typical prior art photodetection array.

Referring to FIG. 1, a prior art photodetection array, comprising a shift counter 10 and a plurality of photo-sensitive devices 11*a* and through 11*e* is illustrated. A clock means 16 and a video amplifier 12 are connected to the array. The shift counter 10 is typically a dynamic shift counter, the construction of which is well known in the art. Each of the photo-sensitive devices 11*a* through 11*e* includes a photo-sensitive solid state device, which may be a photodiode, and a switching means. The switching means and photosensitive device may be a single field effect transistor as is used and known in the prior art. The switching means portion of the photo-detection device is coupled to the shift counter as illustrated by line 15 so that the shift counter may sequentially actuate the switching means associated with each of the devices 11*a* through 11*e*. One terminal of each of the junctions associated with the devices 11*a* through 11*e* is coupled to a common video line 14. The video line is coupled to amplifier 12 and the output video signal is sensed on line 13.

In the prior art array such as the one illustrated in FIG. 1 wherein the photo-sensitive junction is to be operated in the charge storage mode, the shift counter 10 sequentially couples each of the photo-sensitive junctions to the video line. Each of the junctions is then charged through a current path which includes the substrate, which typically forms part of the junction, and the video line 14. The amount of current required to recharge each of the junctions is a function of the total light incident on that junction and this recharging current is sensed on line 13. The shift counter 10 sequentially couples each of the devices 11*a* through 11*e*, one at a time, to the video line 14 such that the result of the scan is a series or train of pulses on line 13.

The clock means 16 provides timing signals, typically a pair of complementary square waves, to the shift counter 10, by leads 18, thus providing the basic timing which determines the scan rate or the rate at which each of the devices 11*a* through 11*e* is coupled to the video line 14. Generally, a starting pulse is applied by lead 17 in order to initiate each scan.

Photodiode arrays such as the one described in FIG. 1 are commercially available. For example, arrays of 64 diodes on 2 mil centers which are fabricated utilizing MOS silicon gate technology are available from Reticon Corporation, Mountain View, Calif. The dynamic shift counter, such as shift counter 10, in this commercially available product is integrated onto the same silicon substrate.

The closeness of the photodiodes of the array of FIG. 1, which determines the resolution of the array, is typically not limited by the size of the photodiodes or other photo-sensitive devices but rather by the size of the shift counter stages utilized to scan the array. The scan rate of the array of FIG. 1 is most severely limited by the response of the amplifier such as amplifier 12, which is required in order to amplify the video signal on line 14 to a usable level.

Figure 2:
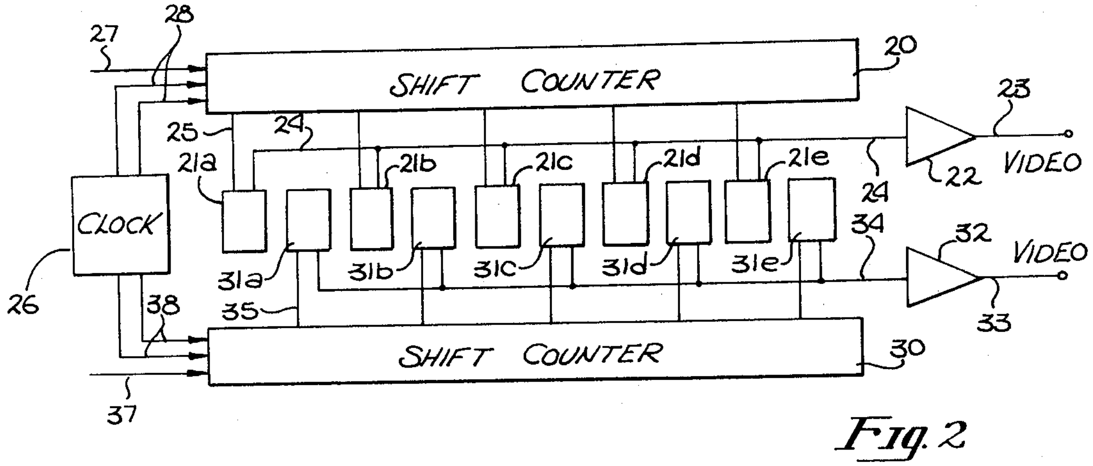
FIG. 2 is a block diagram of a photodetection array built in accordance with the present invention.

In FIG. 2 a photodetection array built in accordance with the present invention is illustrated as including photo-sensitive devices 21*a* through 21*e* and 31*a* through 31*e*. Each of these devices in the presently preferred embodiment comprises a photodiode and a switching means. As previously mentioned, the switching means and photodiode may comprise a single field effect, MOS transistor. The photodiodes associated with devices 21*a* through 21*e* and 31*a* through 31*e* are disposed in a row between upper shift counter 20 and lower shift counter 30. The switching means of the devices 21*a*, 21*b*, 21*c*, 21*d* and 21*e* are coupled to shift counter 20 while the switching means associated with devices 31*a*, 31*b*, 31*c*, 31*d* and 31*e* are coupled to the lower shift counter 30. The devices 21*a–e* are coupled to a common video line 24. The devices 31*a–e* are coupled to a common video line 34. Video line 24, which is disposed between upper shift counter 20 and the row of photodiodes, is coupled to the input of the amplifier 22, the output of amplifier 22 being shown as line 23. Likewise line 34 is disposed between the row of photodiodes and the shift counter 30, this line being coupled to the video amplifier 32 with the output of this amplifier shown as line 33. A clock means 26 for generating timing signals is coupled to the shift counter 20 by leads 28 and to the shift counter 30 by leads 38. Start signal lines 27 and 37 are coupled to shift counters 20 and 30 respectively.

The shift counters 20 and 30 can be standard dynamic shift registers similar to shift register 10 of FIG. 1. The video amplifiers 22 and 32 may be standard video amplifiers similar to amplifier 12 of FIG. 1. Each of the photo-sensitive devices 21*a* through 21*e* and 31*a* through 31*e* may be similar to the devices illustrated in FIG. 1 and previously described as being shown in the prior art. Clock means 26 may be similar to clock means 16 except that the clock means provides two sets of timing signals of the same frequency but of different phase. Clock means 26 may be built utilizing known circuitry. One set of timing signals produced by clock means 26 is coupled to shift counter 20 by leads 28 while the other set is coupled to shift counter 30 by leads 38.

In the operation of the array in FIG. 2, a start signal is applied to shift counter 20 simultaneously with one of the clock pulses on leads 28. A start pulse is applied to shift counter 30 simultaneously with the next following clock pulse on leads 38. Assume for the sake of explanation that the phase 1 signal applied to shift counter 20 first causes the photodiodes associated with device 21*a* to be coupled to video line 24. As this device is recharged the amplitude of this recharging signal may be sensed on line 23. Assume next that the phase 2 signal applied to shift counter 30 causes the diode with device 31*a* to be coupled to line 34 and the current required to recharge that photodiode is presented on lead 33. In a similar fashion the two out-of-phase timing signals applied to the upper shift counter 20 and the lower shift counter 30 next cause devices 21*b*, 31*b*, 21*c*, 31*c*, 21*d*, 31*d* and so on to be sequentially coupled to its respective video line. The signals which appear on lines 23 and 33 may be combined and the result will be a single series or train of pulses representing the sequential charging of each of the photodiodes in the array. It is of course within the scope of the present invention to combine the signals produced on lines 24 and 34 prior to any amplification and to use a single video amplifier to amplify the combined signal. In fact, lines 24 and 34 may be connected internally so that only a single video line is brought out externally.

With the structure of FIG. 2, it is thus possible to overcome the difficulty in the prior art of including more photodiodes in a single row in a self-scanning array. As previously mentioned, while in the prior art diodes may be fabricated on closer centers, it was not practical to fabricate shift counters small enough to accommodate the photodidoes. With the configuration of FIG. 2 two shift counters are utilized and thus photodiodes may be fabricated much closer together even where the prior art shift counters are utilized. In fact, the array of FIG. 2 has been fabricated utilizing 256 photodiodes on 1 mil centers. Since the array of FIG. 2 may utilize two separate video amplifiers, each of which is only required to amplify half the video signals from the row of photodiodes, the array may be made to scan at a much faster rate. For example, if the array of FIG. 2 is built wherein each photodiode is placed on a 2 mil center, which is the distance between the previously mentioned commercial embodiment of the array of FIG. 1, the array theoretically could be scanned at twice the rate of the prior art.

The array of FIG. 2 also has several other advantages over prior art arrays. Typically, defects in the fabrication of MOS devices occur in a single area or cluster of a chip. That is to say, in the fabrication of the device of FIG. 2, if a defective chip is produced, typically, the defective components occur in a single area, for example, the defect may involve a number of connections and components in a stage of one of the shift counters. In the fabrication of the array of FIG. 2, if, for example, all the defects occur in the circuitry involving upper shift counter 20 or any of the photodetection devices coupled to that shift counter, it still will be possible to utilize the lower shift counter 30 and the photodetection devices coupled to that shift counter. Thus, in fabricating the devices of FIG. 1, what might otherwise have been a defective or unusable device may be a usable device but one which only has one-half as many functioning photodiodes. Also, it should be noted that the array of FIG. 2 may be utilized to electrically vary the resolution by varying the phase differences between the timing signals applied to the upper shift counter 20 and lower shift counter 30. For example, if the two shift counters are run in phase, adjacent pairs of diodes are read out simultaneously and thus behave effectively as a single diode with twice the area.

Another advantage: it is possible to have diodes on 1 mil centers while having most of the diode area 2 mils wide, thus giving more area and hence bigger signals with small diode spacing.

Figure 3:
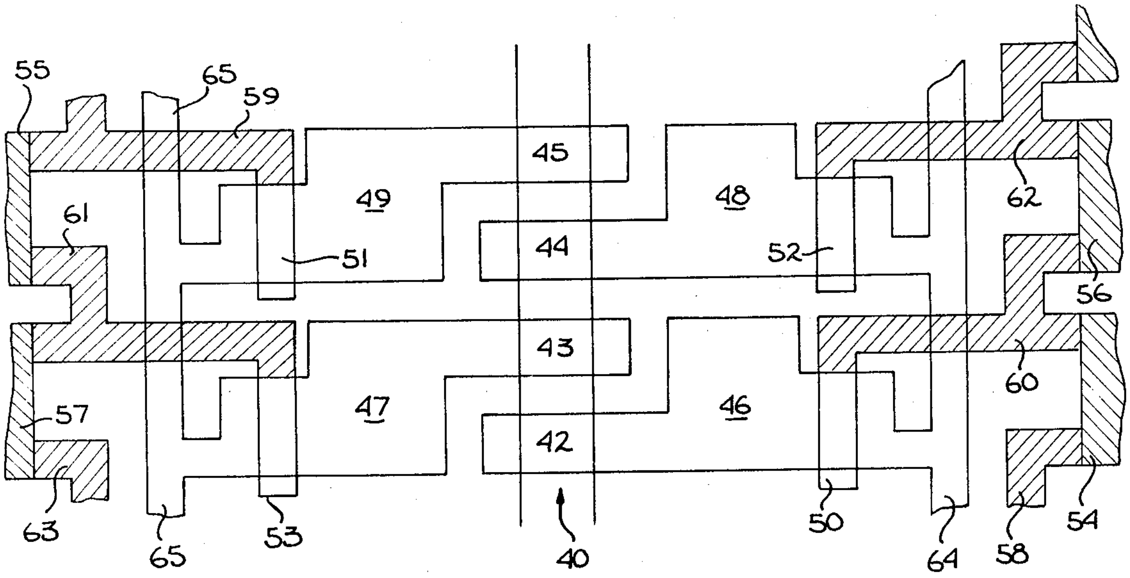
FIG. 3 is a plan view of a portion of a photo-detection array, utilizing photodiodes, built in accordance with the present invention.

Referring to FIG. 3, an interdigitated structure which incorporates the disclosure of FIG. 2, is shown as a partial plane view of a photodiode array. The upper shift counter of FIG. 2 is shown as two sections of a shift counter, sections 54 and 56. Two sections of the lower shift counter 30 of FIG. 2 are shown as sections 55 and 57. A line or conductive path 58 couples the preceding shift counter section with sections 54 while path 60 couples section 54 with section 56 and also provides a path to the switching means 50. In a similar manner path 62 couples section 56 with the next section, not illustrated and also provides a conductive path to switching means 52. Likewise, on the outer shift counter path 63 couples shift counter section 57 with the preceding section, not illustrated, while path 61 couples shift counter section 55 with section 57 and also provides a path to switching means 53. Path 59 couples section 55 with the next section, not illustrated, of the shift counter and provides a path to switching means 51. The sections of the dynamic shift counter shown as sections 54, 56, 55 and 57 may be of conventional construction known and used for dynamic shift counters.

An aperture region 40, which is typically covered with a glass window, allows incident light to strike the photodiodes illustrated in the array. The photodiode coupled to switching means 50 comprises a first photo-sensitive region 42 which extends into the aperture region 40 and a second region 46, which is coupled to video line 64. On the opposite side of this photodiode is a photodiode coupled to video line 65 which comprises a first photo-sensitive region 43, which extends into the aperture region 40 and a second region 47. Likewise, the diode coupled to switching means 52 comprises a first region 44 and a second region 48. Opposite this photodiode is a diode coupled to switching means 51 comprising a first region 45 and a region 49. It should be noted that the photodiodes in this array form a symmetrical interlocking pattern above aperture region 40.

A photodiode array utilizing the pattern shown in FIG. 3 may be fabricated on a single silicon chip utilizing the same MOS technology required to produce the prior art photodetection array described in conjunction with FIG. 1. An advantage to the structure of FIG. 1 is that it readily allows the photo-sensitive portions of the photodiodes, that is, regions 42, 43, 44 and 45, to be fabricated on a substrate with close centers and, in fact, 1 mil centers have been fabricated with MOS technology. Each of the photo-sensitive regions of the diodes (i.e., region 42) is coupled to a region (i.e., region 46) of the same conductivity type. The second region (i.e., region 46) provides a larger area for storing an electrical charge. This is particularly important since the photodiodes are operated in a charge storage mode.

The present invention may also be utilized with other interdigitated structures where more than a single video line is utilized between the row of photodiodes and a shift counter. One such structure which may be adapted to the present invention is described in Solid State Technology, July, 1971, *A New Self-Scan Photodiode Array* by R. E. Dyck and G. P. Weckler. In this approach to a self-scanning array, a single command from a shift counter is utilized to couple two adjacent photodiodes to two separate video lines. One video line is directly coupled to an amplifier while the other is coupled to the same amplifier through a delay line. It will be readily apparent to one skilled in the art that the present invention may be utilized in such a structure by including an additional shift counter opposite the shift counter disclosed for that structure and by interlacing photodiodes with the disclosed photodiodes.

Thus, the present invention, with the use of existing technology, has substantially improved the self-scanning photodiode or phototransistor arrays by the incorporation of an additional shift counter and by a structure which permits two or more separate video amplifiers to be utilized for the amplification of signals from a single row of photo-sensitive devices.

I claim:

1. A photodetection array comprising:

a row of photo-sensitive devices disposed on a substrate;

at least two shift counters disposed one on each side of said row of photo-sensitive devices on said substrate, each shift counter being coupled to alternate photo-sensitive devices in said row of photo-sensitive devices;

at least two video lines disposed on said substrate each coupled to alternate photo-sensitive devices; and timing means for simultaneously driving said two shift counters such that said photo-sensitive devices in said row are sequentially selected;

whereby as said row of devices are selected signals representative of the light incident on said row of photo-sensitive devices may be detected on said video lines.

2. A photodetection array defined by claim 1 wherein each photo-sensitive device comprises a photodiode and a switching means.

3. The photodetection array defined by claim 1 wherein said substrate comprises silicon.

4. A photodiode array comprising:

an upper and lower shift counter in juxtaposition disposed on a substrate;

an elongated aperture region disposed between said upper and lower shift counters on said substrate;

a plurality of pairs of photodiodes, forming a row disposed between said shift counters disposed on said substrate, each pair comprising an upper diode coupled to said upper shift counter having a first photo-sensitive region extending into said aperture region and a larger second region disposed between said aperture region and upper shift counter; a lower diode coupled to said lower shift counter having a first photo-sensitive region extending into said aperture region, adjacent to said first photo-sensitive region of said upper diode and a second larger region disposed between said aperture region and said lower shift counter such that said upper and lower diodes form an interlocking pattern;

at least one upper video line disposed between said aperture region and said upper shift counter on said substrate, coupled to said upper diodes;

at least one lower video line disposed between said aperture region and said lower shift counter on said substrate coupled to said lower diodes; and, timing means for simultaneously driving said upper and lower shift counters such that said photodiodes in said row are sequentially selected;

whereby as said row of photodiodes are sequentially selected signals representative of the incident light on said row of photodiodes may be sensed on said video lines.

5. A photodetection array comprising:

a first and a second shift counter in juxtaposition disposed on a substrate;

a row of photo-sensitive devices disposed between said shift counters on said substrate, with every other photo-sensitive device in said row being coupled to said first shift counter and with said remaining photo-sensitive devices in said row being coupled to said second shift counter;

a first video line, disposed between said first shift counter and said row of phoo-sensitive devices on said substrate, said first video line being coupled to said every other photo-sensitive device in said row; and a second video line, disposed between said second shift counter and said row of photo-sensitive devices on said substrate, said second video line being coupled to said remaining photo-sensitive devices in said row; and, timing means for simultaneously driving said first and second shift counters such that said photo-sensitive devices in said row of devices are sequentially selected;

whereby as said row of devices are selected signals representative of the light incident on said row of photo-sensitive devices may be detected on said video lines.

6. The photodetection array defined by claim 5 wherein said photo-sensitive devices include photodiodes which are electrically charged, and the charging current is sensed on said video lines.

7. The photodetection array defined in claim 6 wherein each photo-sensitive device also includes a semiconductor switching means disposed on said substrate which is coupled between the respective shift counters and photodiodes, and which on command from said shift counter completes an electrical path between said photodiode and respective video lines.

8. The photodetection array defined in claim 7 wherein said substrate is silicon and said photo-sensitive devices and shift counters are MOS devices.

* * * * *